US012676285B2

(12) United States Patent (10) Patent No.: US 12,676,285 B2
Baker et al. (45) Date of Patent: Jul. 7, 2026

(54) SUBSTRATE STATE DETECTION FOR PLASMA PROCESSING TOOLS

(71) Applicant: Lam Research Corporation, Fremont, CA (US)

(72) Inventors: Noah Elliot Baker, West Linn, OR (US); Thomas Mcdaniel, Wilsonville, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 620 days.

(21) Appl. No.: 17/288,468

(22) PCT Filed: Oct. 16, 2019

(86) PCT No.: PCT/US2019/056549
§ 371 (c)(1),
(2) Date: Apr. 23, 2021

(87) PCT Pub. No.: WO2020/092005
PCT Pub. Date: May 7, 2020

(65) Prior Publication Data
US 2021/0391141 A1 Dec. 16, 2021

Related U.S. Application Data

(60) Provisional application No. 62/752,707, filed on Oct. 30, 2018.

(51) Int. Cl.
*H01J 37/32* (2006.01)
*H01J 37/244* (2006.01)

(52) U.S. Cl.
CPC ...... *H01J 37/244* (2013.01); *H01J 37/32082* (2013.01); *H01J 37/32926* (2013.01);
(Continued)

(58) Field of Classification Search
CPC .............. H01J 37/344; H01J 37/32082; H01J 37/32926; H01J 2237/2007;
(Continued)

(56) References Cited

U.S. PATENT DOCUMENTS 5,872,694 A * 2/1999 Hoinkis .................. H10P 72/72
361/234
10,804,125 B2 * 10/2020 Gadre ............... H01J 37/32183
(Continued)

FOREIGN PATENT DOCUMENTS

TW 200836291 10/2007
TW 201801130 A 1/2018
WO 2006036821 A2 4/2006

OTHER PUBLICATIONS

International Search Report from International Application No. PCT/US2019/056549 dated Jan. 30, 2020.
(Continued)

*Primary Examiner* — Charlee J. C. Bennett
(74) *Attorney, Agent, or Firm* — Alleman Hall LLP

(57) ABSTRACT

A substrate processing tool capable of detecting a gap and/or shifting of a substrate clamped to a clamping surface in a processing chamber based on observed behavior of RF power delivered to the processing chamber during processing. The behavior of the RF power is observed by comparing a voltage-current phase angle difference and/or impedance magnitude change between a real RF power component and a reactive RF power component of the RF power delivered to the processing chamber.

30 Claims, 9 Drawing Sheets

(52) U.S. Cl.

CPC ................. *H01J 2237/2007* (2013.01); *H01J 2237/24564* (2013.01); *H01J 2237/24592* (2013.01)

(58) Field of Classification Search

CPC ... H01J 2237/24564; H01J 2237/24592; H01J 2237/332–3348

USPC ..... 156/345.28, 345.1–345.55; 118/715–733

See application file for complete search history.

(56) References Cited

U.S. PATENT DOCUMENTS

| | | | |
|---|---|---|---|
| 2005/0061442 | A1 | 3/2005 | Higashiura |
| 2008/0084650 | A1* | 4/2008 | Balasubramanian ........................ H01J 37/32431 |
| | | | 361/234 |
| 2013/0052756 | A1 | 2/2013 | Okujo et al. |
| 2017/0162417 | A1 | 6/2017 | Ye et al. |
| 2018/0025930 | A1* | 1/2018 | Augustyniak ..... H01L 21/67207 |
| | | | 438/798 |
| 2018/0076098 | A1* | 3/2018 | Kim ........................ H10P 74/23 |
| 2018/0144911 | A1* | 5/2018 | Ashraf ............. H01J 37/32082 |

OTHER PUBLICATIONS

Written Opinion from International Application No. PCT/US2019/056549 dated Jan. 30, 2020.

Taiwanese Office Action from Taiwanese Application No. 108138749 dated Aug. 11, 2023.

Taiwan Intellectual Property Office, Office Action Issued in Application No. 108138749, Apr. 8, 2024, 15 pages.

Taiwan Intellectual Property Office, Office Action and Search Report Issued in Application No. 108138749, Oct. 1, 2024, 14 pages.

* cited by examiner

Normal run without declamping

*"Wafer declamp detected"*

SUBSTRATE STATE DETECTION FOR PLASMA PROCESSING TOOLS

CROSS REFERENCE TO RELATED APPLICATION

This application claims the benefit of priority of U.S. Application No. 62/752,707, filed Oct. 30, 2018, which is incorporated herein by reference for all purposes.

BACKGROUND

The present invention relates to plasma processing tools used for processing substrates, and more particularly, to a plasma processing tool capable of detecting a state of a substrate undergoing processing by observing the behavior of the radio frequency (RF) used to create the plasma.

Plasma processing tools are commonly used for used for processing substrates.

For example, a Plasma Enhanced Chemical Vapor Deposition (PECVD) tool is used to deposit films on substrates. PECVD tools typically include a process chamber and a pedestal within the chamber for positioning and clamping a substrate onto a clamping surface. The purpose of the clamping during deposition is to (1) hold the substrate as flat as possible to the clamping surface and (2) maintain the substrate in its proper position, which is typically centered on the clamping surface.

While most clamping pedestals perform adequately, issues remain. One such issue is that gaps may develop between the backside of a substrate and the opposing clamping surface during processing. The deposition of films often causes surface stresses to act on the substrate. The thicker the deposited film, the greater the surface stresses. These surface stresses may cause the substrate to bow in places, causing regions of the substrate to lift away from the clamping surface, creating gaps, partially or fully de-clamping the substrate from the clamping surface.

Shifting of the substrate on the clamping surface can also be an issue. Shifting may occur because unwanted lateral forces acting on the substrate, overcoming the clamping force, resulting in the movement of the substrate. In the incorrect position, the film(s) deposited on the substrate is/are likely to create misalignment issues.

The better the thickness, uniformity and alignment of films deposited on substrates, the more reliable the final product will be (e.g., chips or integrated circuits on a semiconductor substrate). With gaps, partial or complete de-clamping and/or shifting, the thickness, uniformity and alignment of deposited thin films may all be adversely affected, resulting in fabrication defects. With fabrication defects, yields of the substrates are typically reduced.

SUMMARY

A substrate processing tool capable of detecting a gap and/or shifting of a substrate clamped to a clamping surface in a processing chamber based on observed behavior of RF power delivered to the processing chamber during processing. The behavior of the RF power is observed by comparing a voltage-current phase angle difference and/or impedance magnitude change between a real RF power component and a reactive RF power component of the RF power delivered to the processing chamber. When either a gap and/or shifting of the substrate is/are detected, the substrate is flagged. In optional embodiments, recovery options may be taken or the substrate may be scrapped as defective.

BRIEF DESCRIPTION OF THE DRAWINGS

The present application, and the advantages thereof, may best be understood by reference to the following description taken in conjunction with the accompanying drawings in which.

In the drawings, like reference numerals are sometimes used to designate like structural elements. It should also be appreciated that the depictions in the figures are diagrammatic and not necessarily to scale.

DETAILED DESCRIPTION

The present application will now be described in detail with reference to a few non-exclusive embodiments thereof as illustrated in the accompanying drawings. In the following description, numerous specific details are set forth in order to provide a thorough understanding of the present disclosure. It will be apparent, however, to one skilled in the art, that the present discloser may be practiced without some or all of these specific details. In other instances, well known process steps and/or structures have not been described in detail in order to not unnecessarily obscure the present disclosure.

Substrate Processing Tool

Figure 1:
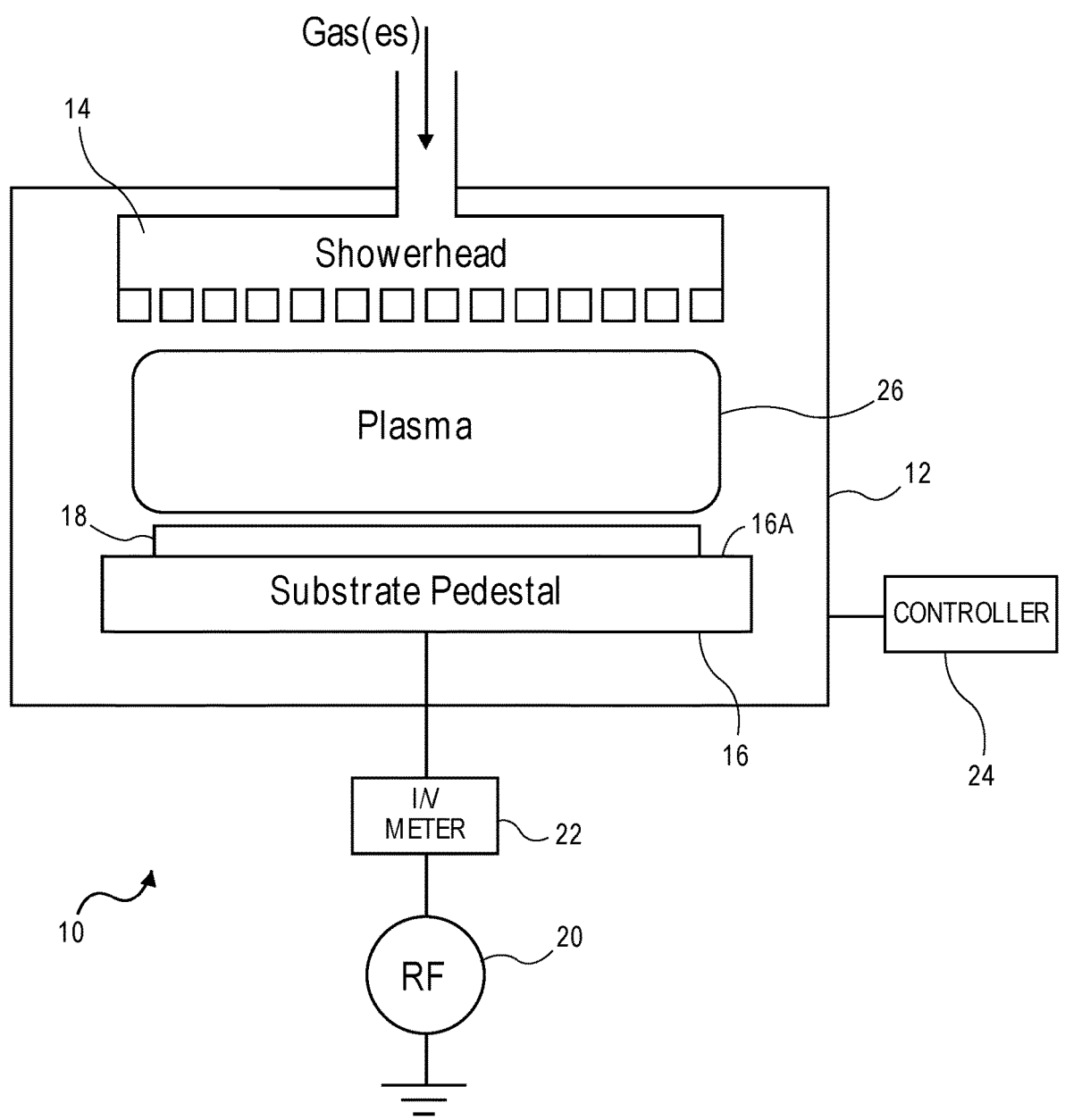
FIG. 1 is a block diagram of a plasma processing tool in accordance with a non-exclusive embodiment of the invention.

Referring to FIG. 1, a block diagram of a substrate processing tool 10 is illustrated. In various embodiments, the substrate processing tool 10 may be a Plasma Enhanced Chemical Vapor Deposition (PECVD) tool, a Low Pressure (LPCVD), Ultra High Vacuum (UHVCVD), Atomic Layer Deposition (ALD), Plasma-Enhanced Atomic Layer Deposition (PEALD) or any other type of plasma tool used for depositing films. It is also noted that the processing tool 10 is not limited to just deposition tools. In addition, the substrate tool 10 may also include plasma etching tools as well. As such, the term "tool" as used herein should be broadly construed to cover any type of tool useful for processing substrates of any kind, including but not limited to semiconductor wafers, flat panel displays, photovoltaic device, or any other type of work piece.

In a non-exclusive embodiment, the substrate processing tool 10 includes a processing chamber 12, a shower head 14, a substrate pedestal 16 having a clamping surface 16A, a substrate 18 to be processed, a Radio Frequency (RF) generator 20, a Voltage/Current ("V/I") meter 22 and a controller 24.

The substrate pedestal 16 is provided to position and clamp the substrate 18 to the clamping surface 16A within the processing chamber 12. After a substrate 18 is placed on the surface 16A, a "chucking" or clamping force is applied. The purpose of the clamping force is to (1) maintain the substrate in its correct position (i.e., aligned), typically centered on the clamping surface 16A and (2) pull the back surface of the substrate 18 down, keeping the substrate 18 as flat as possible. In various embodiments, a number of well known clamps may be used, such as an Electrostatic Chuck (ESC), a vacuum chuck, other types of chucks, or a combination thereof.

In the illustrated embodiment, the RF generator 20 is provided to deliver RF power to the chamber 12 via an electrical cable coupled to an electrode (both not shown) provided in the substrate pedestal 16. Although not illustrated, a second RF generator optionally may be coupled to the shower head 14. The RF generator(s) are capable of generating high, medium and/or low RF frequencies. For example, in the case of high frequencies, the RF generator(s) may generate frequencies ranging from 2-100 MHz and preferably 13.56 MHz or 27 MHz. When low frequencies are generated, various ranges or values that may be used are 50 KHz to 2 MHz, 350 to 600 KHz, or approximately 400 KHz.

During operation, reactant gas(es) are supplied into the process chamber 12 through the shower head 14. Within the shower head 14, the gas(es) is/are distributed via one or more plenums (not illustrated) into the chamber 12, in the general area above the surface of the substrate 18 to be processed. The RF power, generated by the RF generator(s) 20, is delivered via electrode(s) in the substrate pedestal 16 and/or shower head 14 respectively. The delivered RF power generates plasma 26 within the processing chamber 12. Energized electrons in the plasma 26 ionize or dissociate (i.e., "crack") from the reactant gas(es), creating chemically reactive radicals. As these radicals react, they deposit and form a film on the substrate 18. By controlling the gasses, the timing, and the RF power delivered to the chamber 12, the thickness and material of the films deposited on the substrate can all be precisely controlled.

The V/I meter 22 is connected in series along the cable between the electrode in the substrate pedestal 16 and the RF generator 20 used to deliver the RF power into the chamber 12. The V/I meter 22 is essentially a probe that is capable of measuring certain characteristics of the RF power delivered to the processing chamber 12, including (a) voltage, (b) current and (c) the phase angle between the voltage and the current. The V/I meter 22 is thus capable of monitoring the behavior of RF power in the chamber 12, providing insights such as how the RF energy is being generated and accumulating in the processing chamber 12, which in turn, provides information on the state of the substrate within the processing chamber 12 during processing as further described below.

The controller 24 is used to control operation of the substrate processing tool 10 in general, including process conditions during deposition, post deposition, and/or other process operations. As described in more detail herein, the controller 24, operating in cooperation with the V/I meter 22, also operates as a substrate state detection system for monitoring and detecting the state of a substrate 18 being processed in the chamber 12. In particular, the substrate state detection system is arranged to determine if bowing and/or gaps have formed between the substrate 18 and the clamping surface 16A and/or if the substrate has shifted from its centered or aligned position.

Real and Reactive RF Power

The RF power delivered to the processing chamber 12 has two components, real and reactive power. Real power is the RF power delivered into the system that is dissipated as energy. Reactive power is the RF power that is delivered into the system within the processing chamber 12, but is not dissipated. In other words, the potential of the reactive RF power remains in the system because it is not used. During the processing of a substrate 18, a certain amount of the RF power delivered to the chamber 12 is dissipated as real power, while the remaining reactive RF power is not dissipated.

Variable Capacitance and RF Power

When chucked to the clamping surface 16A, a substrate 18 becomes capacitively couple to both the underlying substrate pedestal 16 and the RF induced plasma in the chamber 12. When issues with the substrate occur, such as gaps, partial or complete de-clamping, or shifting, the capacitance in the system changes. As described in detail below, the changes in capacitance causes changes in the delivered RF power in the processing chamber 12. Thus, by monitoring changes of the delivered RF power, the state of the substrate 18 can be inferred.

The Applicant discovered that there is a correlation between (1) reflected RF characteristics of the plasma and (2) either a partial or complete separation of the substrate 18 from the clamping surface 16A (i.e., gaps) and/or the shifting of the substrate 18. In other words, gaps and/or shifting of the substrate 18 causes capacitance changes, which are reflected in the delivered RF power and the plasma energy within the processing chamber 12.

By observing changes in the behavior of the RF, assumptions can be made about the state of the substrate 18, such as if the substrate has partially or fully de-clamped or shifted. When such an assumption is made, a number of actions can be made, including flagging the substrate and/or implementing one or more recovery process options.

The V/I meter 22 is used to measure voltage and current component of the RF power in the chamber 12, which is typically in the form of sine waves. Changes in the capacitance in the chamber 12 cause changes in both the magnitude of the reactive component with respect to the magnitude real component of the RF power and thus the total impedance magnitude and the phase angle between the voltage and current. By monitoring these changes, either separately in conjunction with one another, the Voltage-Current Phase angle and/or the Impedance Magnitude (Z) of the RF power can be used to determine the state of the substrate 18.

Circuit Diagram Model—No Substrate De-Clamping or Shifting

Figure 2:
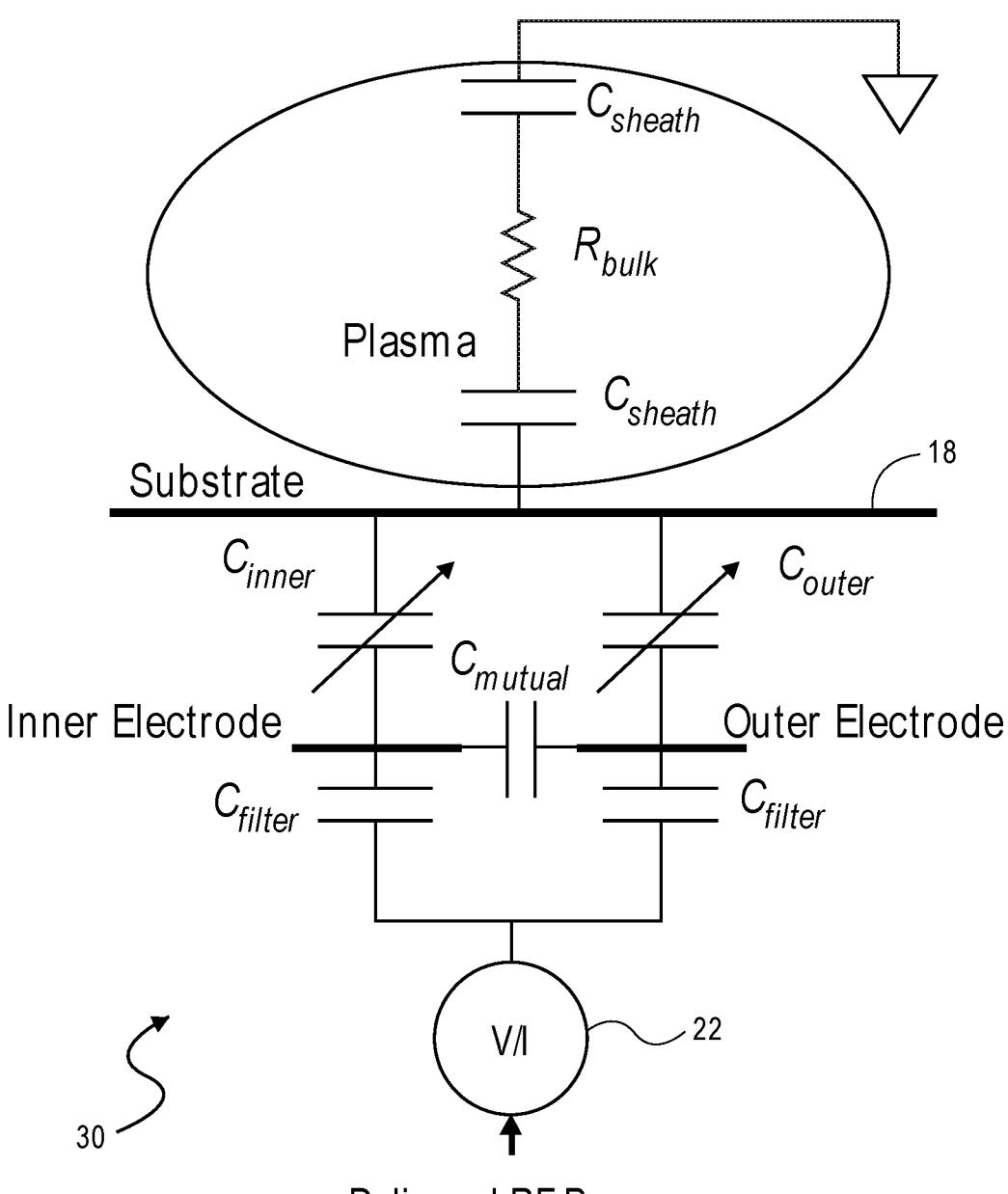
FIG. 2 is a circuit diagram modeling a clamped substrate during processing in a processing chamber of a substrate processing tool.

Referring to FIG. 2, a circuit diagram 30 is illustrated modeling a substrate in a processing chamber 12 clamped to a substrate surface 16A having two (i.e., inner and outer) electrodes, such as used with an ESC chuck. In this circuit diagram 30, the substrate 18 is properly positioned (e.g., centered) on the clamping surface 16A of the pedestal 16 and there is no to minimal gaps. This circuit diagram 30 includes:

Variable capacitors $C_{inner}$ and $C_{outer}$, corresponding to the capacitors formed by the substrate 18 and inner and outer electrodes respectively. These capacitors are variable because their capacitive value may vary. With no gaps between the substrate 18, then the capacitive value is high. On the other hand if gaps develop, then the capacitive value decreases.

Capacitor $C_{mutual}$, which is the value of the capacitance between the inner and outer electrodes. This capacitance value is fixed.

Two capacitors $C_{filter}$, which are both fixed values. The two $C_{filter}$ capacitors couple the delivered RF power from RF generator 20 to the inner and outer electrodes respectively.

Capacitors $C_{sheath}$, which is defined as the "Plasma Imaginary Impedance" of the plasma, which is typically capacitive.

Resistor $R_{bulk}$, which defines the "Plasma Real Impedance" in the bulk of the plasma, which is generally in the vicinity above the center of the pedestal 16.

In this scenario, the capacitance of the two variable capacitors $C_{inner}$ and $C_{outer}$ remain high so long as the substrate remains properly clamped (i.e., no or minimal gaps form due to de-clamping) and/or the substrate remains in its proper position (i.e., aligned). The changes in the magnitude of the reactive component with respect to the magnitude real component of the RF power are therefore minimal. Deviations in the voltage phase angle and impedance magnitude are therefore also minimal. The state of the substrate 18 can therefore be inferred, with a high degree of confidence, that there are no de-clamping and/or shifting issues.

Circuit Diagram Model—with Substrate De-Clamping or Shifting

Figure 3:
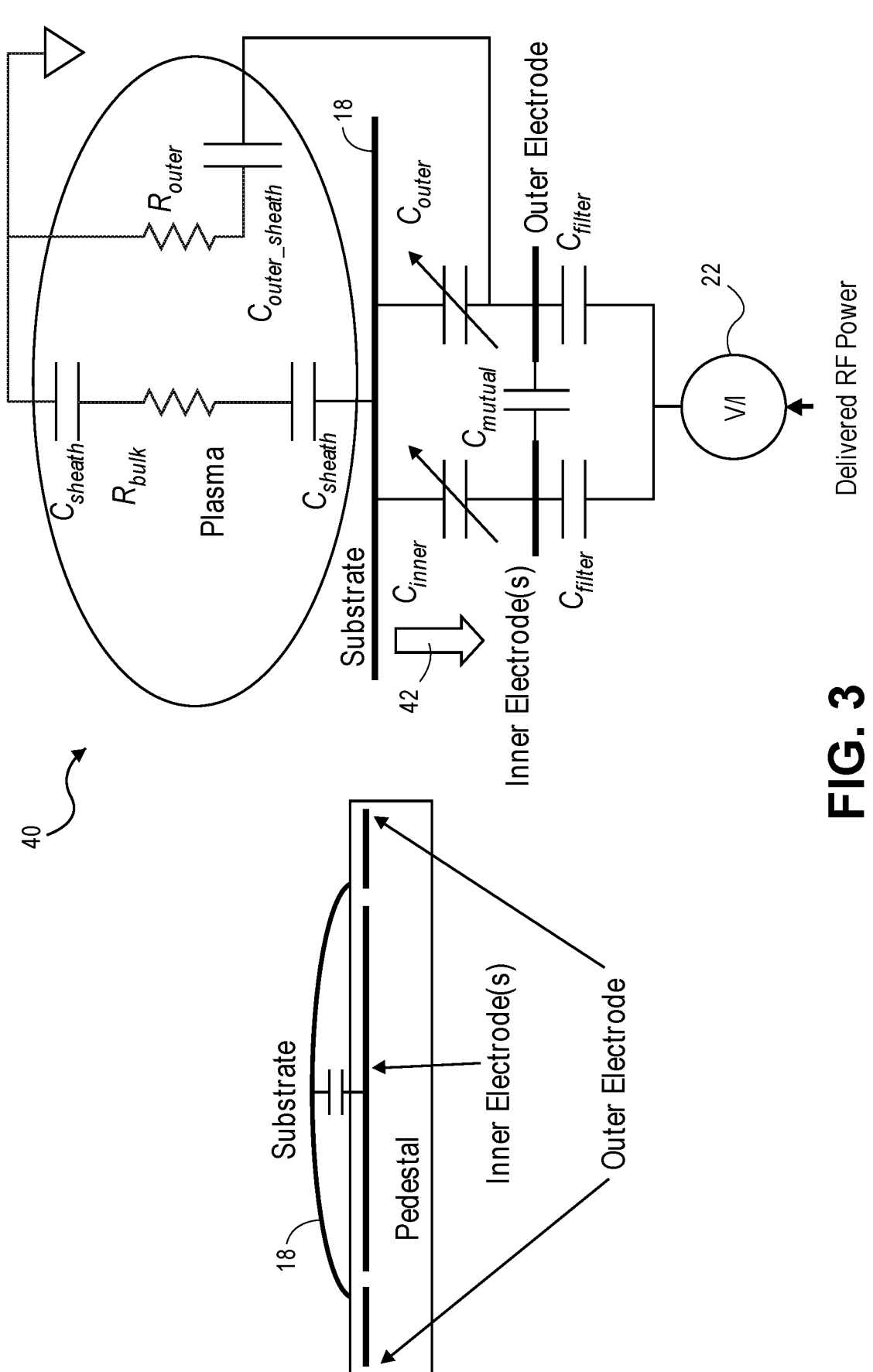
FIGS. 3-5 are each circuit diagrams modeling a substrate during processing when one or more various issues occur, such as gaps, partial or complete de-clamping or shifting.
Figure 4:
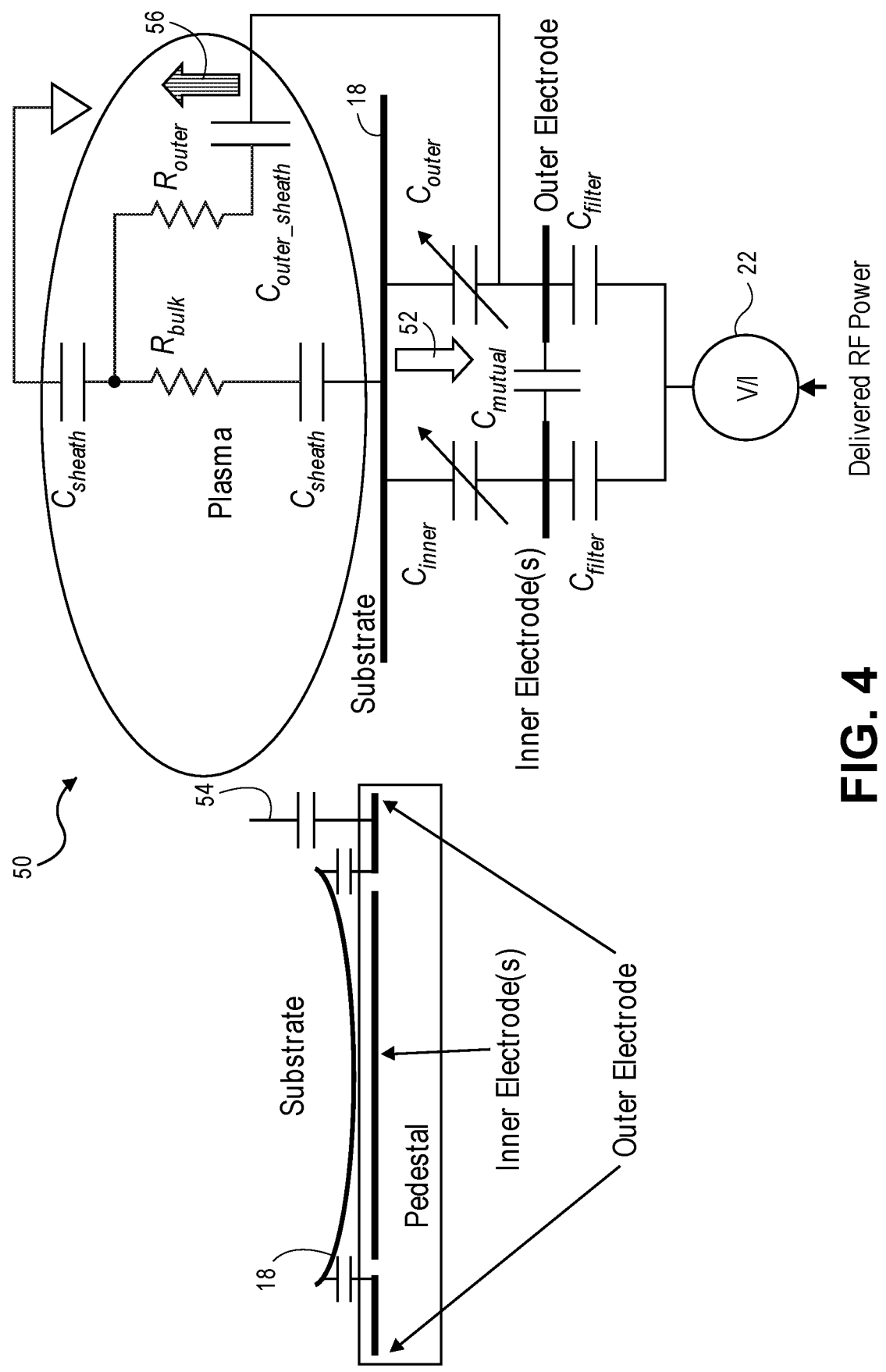
Figure 5:
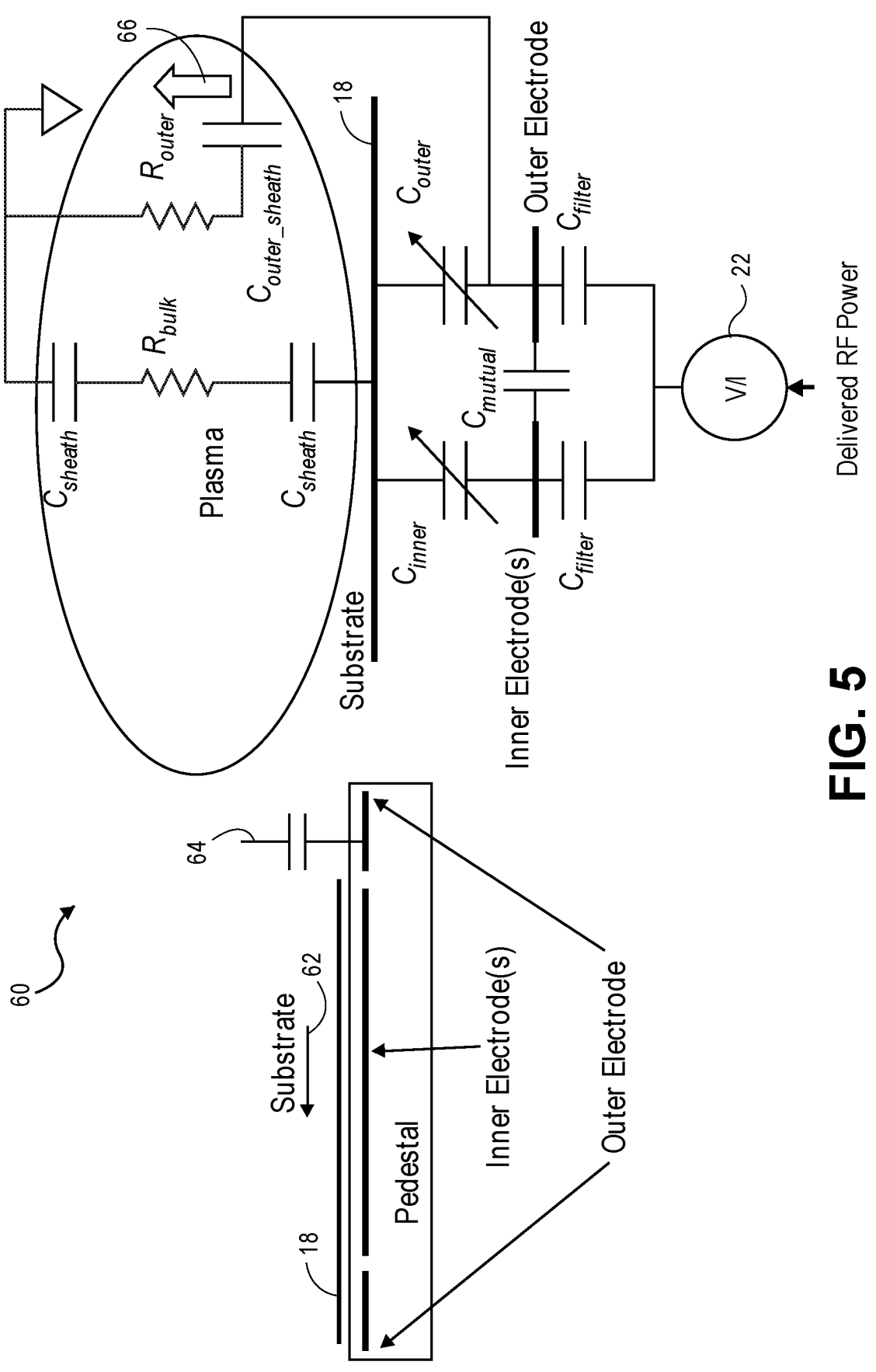

FIGS. 3-5 are each circuit diagrams modeling a substrate with various clamping and/or shifting issues in the same system depicted in FIG. 2. In each case, depending on the type of issue, the capacitance as seen by the system in the processing chamber 12 changes, signifying either a clamping and/or a shifting issue. The circuit models in each of these cases are the same as described above, except for the additions of $C_{outer\_sheath}$ and $R_{outer}$, which define the Plasma Imaginary Impedance and Real Plasma Impedance of the plasma at and beyond the periphery the clamping surface 16A of the pedestal 16 respectively.

It should be noted that the issues as illustrated in each of FIG. 2 through FIG. 5 are exaggerated for the sake of clarity. In real world situations, the degree of bowing and/or shifting is typically not as dramatic as shown.

Referring to FIG. 3, a circuit diagram 40 modeling a substrate that is bowed at or near its center is shown, as best illustrated in the left side of the diagram. When this scenario occurs, the main change relative to the circuit model of FIG. 2 is that the capacitance of $C_{inner}$ decreases, as signified by the arrow 42.

Referring to FIG. 4, a circuit diagram 50 modeling a substrate that is bowed at or near its edges is shown, as best illustrated in the left side of the diagram. When this scenario occurs, a number of changes occur relative to the circuit model of FIG. 2. The capacitance of $C_{outer}$ decreases, as signified by the arrow 52. As a result, the impedance and phase angle increase as $C_{outer}$ decreases, as signified by the arrow 56.

Referring to FIG. 5, a circuit diagram 60 is shown modeling a substrate that has shifted out of position is shown, as best illustrated by arrow 62 in the left side of the diagram. When this scenario occurs, the capacitance of the capacitors $C_{inner}$ and $C_{outer}$ remain high as the gaps between the substrate 18 and electrodes remain minimal. However, other changes occur relative to the circuit model illustrated in FIG. 2. There is a decrease in the capacitance between the outer electrode and the plasma, signified by the capacitor 64. In response, the impedance through the plasma increases along with the phase angle as the capacitance of 64 decreases, as signified by the arrow 66.

In each of the examples provided in FIGS. 3-5, gaps and/or shifting causes a change in the capacitance in the processing chamber 12. As a result, the V/I meter 22 senses, in each scenario, changes in the magnitude of the reactive component with respect to the magnitude real component of the RF power. As a result, there is a deviation in the voltage-current phase angle and the impedance magnitude.

It should be understood that the relative change in capacitance is indicative of the severity of the issue(s) experienced by the substrate 18. If the substrate 18 has experienced catastrophic de-clamping, or has shifted significantly, then the capacitance reduction will be significant. Conversely, if the gaps, de-clamping and/or shifting is minimal, then the drop in capacitance will likewise be minimal. The degree of the deviation in the voltage-current phase angle and/or the impedance magnitude is therefore proportional to the degree or severity of the gaps, de-clamping and/or shifting issue with a given substrate 18.

It should be noted that the substrate issue detection approach described herein does not necessarily distinguish or identify the specific problem as being either partial or complete de-clamping and/or shifting. The approach, however, does identify that generally there is an issue. As a result, the substrate 18 can be either flagged, or some other recovery process option may be implemented.

Alternative Embodiments—Substrate Pedestals

The substrate state detection approach as described may be used with any substrate holder having at least one RF electrode, such as for example, a vacuum chuck.

Figure 6:
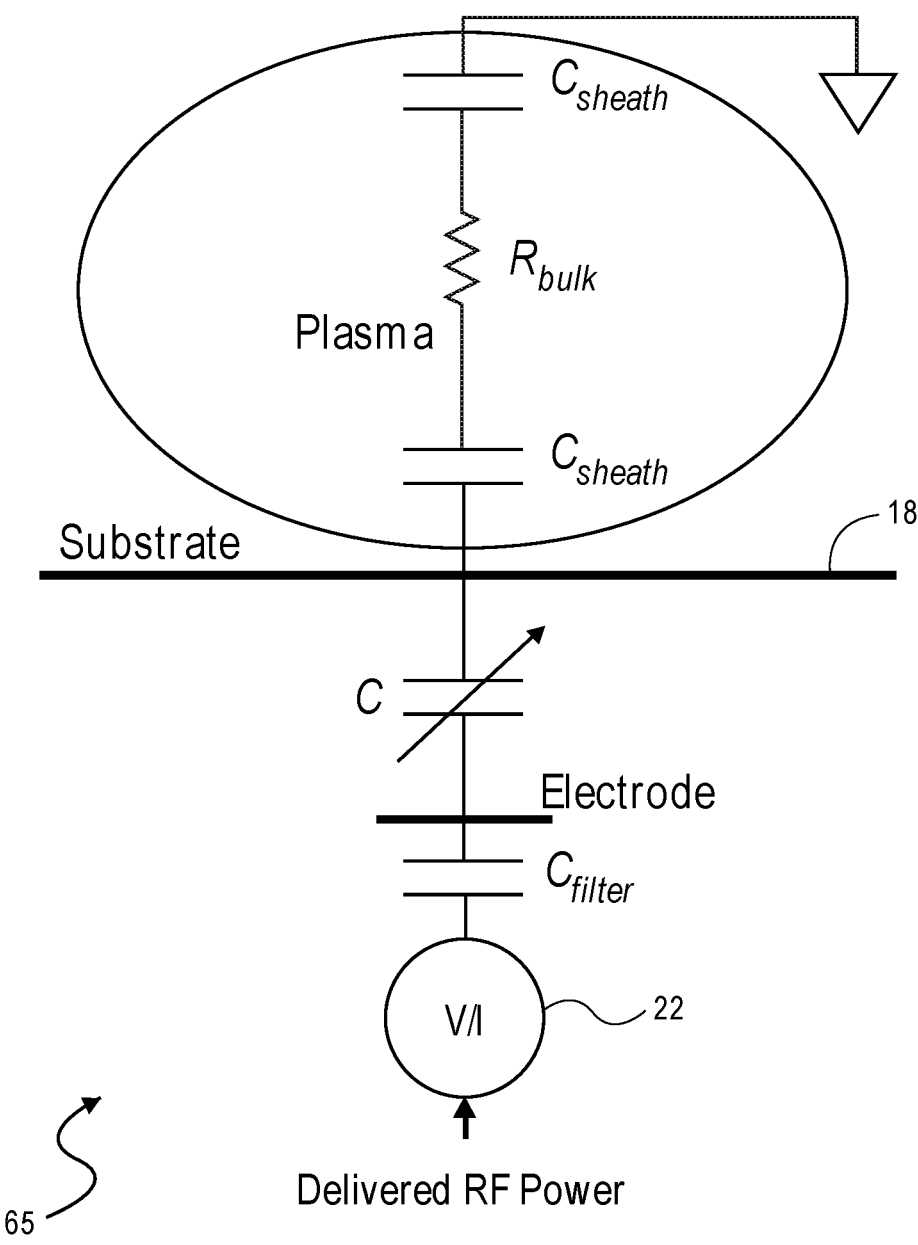
FIG. 6 is another circuit diagram modeling a clamped substrate in a substrate processing tool.

With reference to FIG. 6, a circuit diagram 65 modeling a substrate in a processing chamber clamped to a substrate holder having a single electrode is illustrated. In this embodiment, the capacitance between the substrate 18 and the electrode is indicated by the single capacitor C. Otherwise, the model is essentially the same as depicted in FIG. 2 and issues of gaps and/or shifting would be ascertained in a similar manner as described above with respect to FIGS. 3-5.

It should be understood that the embodiments provided herein are merely exemplary and are not intended to be limiting in any manner. On the contrary, the substrate state detection approach as described herein may be used with any substrate pedestal with one or multiple electrodes, regardless of the type of clamping or chucking mechanism used.

Confidence Thresholds

In accordance with a non-exclusive embodiment, a confidence threshold may be used to determine if a given substrate 18 is experiencing any de-coupling or shifting issues during processing. As noted above, the degree of the phase angle and/or total impedance magnitude is proportional to the degree or severity of any partial or complete de-clamping or shifting of the substrate 18. With this in mind, sample results, as captured by the V/I meter 22, during the processing of a given substrate 18 may be plotted on a static scale ranging from a high confidence to low confidence level. If one or multiple samples for a given substrate 18 exceed a static confidence threshold within the high to low confidence range, then the substrate can be flagged as having an issue with either de-clamping or having improperly shifted.

In an alternative embodiment, the confidence threshold may be dynamic and shift over time during the processing of a substrate. For example, from empirical data collected from a number of substrate processing runs with little to no gaps, bowing and/or shifting issues, a "golden curve" generated from near ideal sample points may be plotted over time during the processing of sample substrates. Then, based on the golden curve, upper and lower confidence boundary thresholds, which similarly vary over time, can be defined above and below the golden curve. With this approach, the processing of a substrate is considered normal provided the collected samples remain within (i.e., do not exceed) the upper and lower boundaries. On the other hand if the samples transition outside (i.e., exceed) either the upper or lower boundaries, then the substrate can be flagged as having a gapping, bowing and/or shifting issue.

Substrate Processing Flow Diagram

Figure 7:
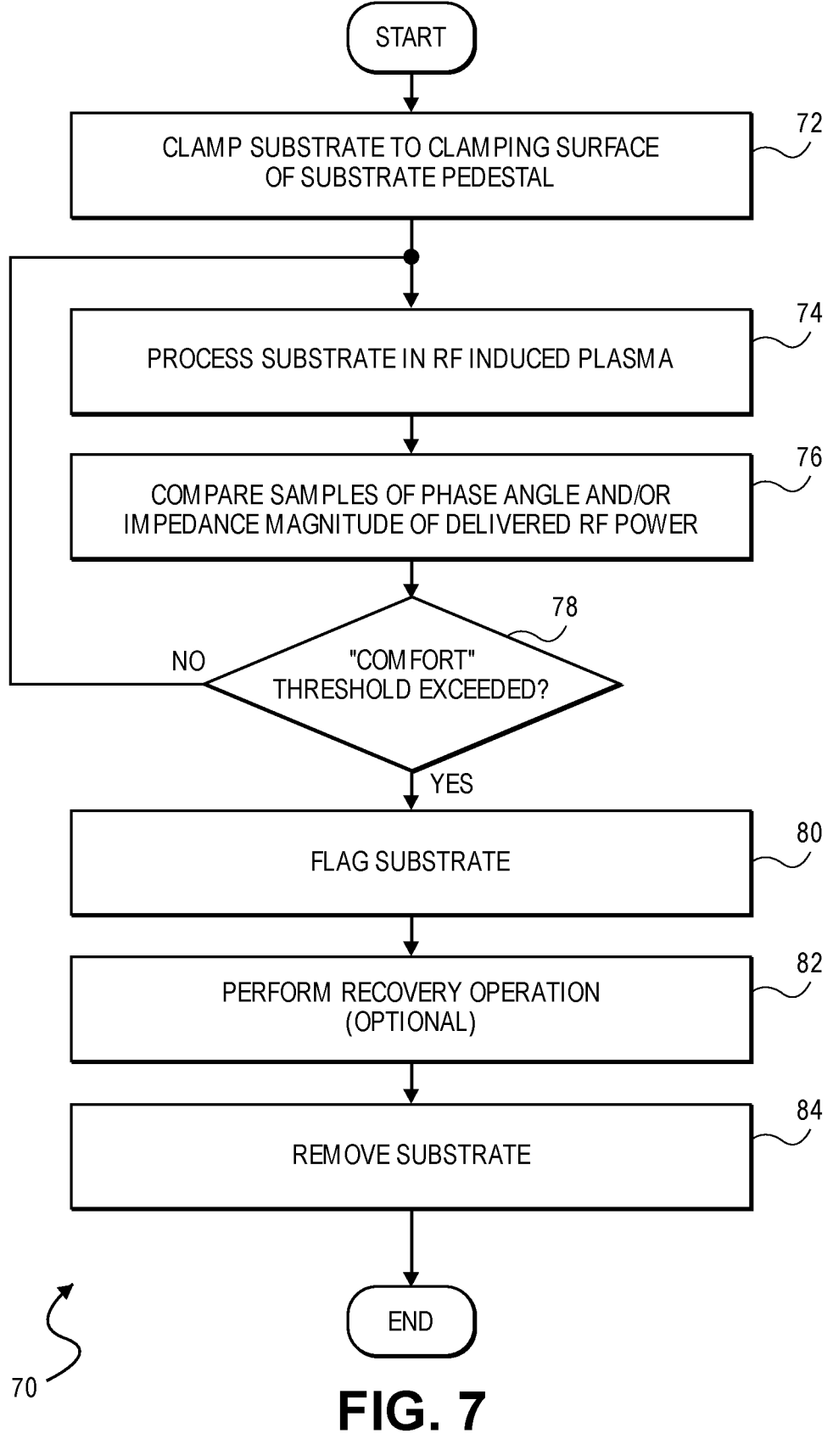
FIG. 7 is a flow diagram illustrating steps for processing a substrate in accordance with a non-exclusive embodiment of the invention.

Referring to FIG. 7, a flow diagram 70 illustrating steps for processing a substrate 18 in accordance with a non-exclusive embodiment of the invention is shown.

In step 72, a substrate 16 to be processed is clamped to clamping surface 16A of the substrate pedestal 16 within the processing chamber 12 of the substrate processing tool 10. Typically, the substrate 18 is centered or otherwise aligned on the clamping surface 16A and then clamped.

In step 74, the substrate is processed in a RF induced plasma by depositing a film on the top surface of the substrate. As noted above, the thickness of the film may cause surfaces stresses that result in the substrate 18 bowing, result in gaps forming between the substrate 18 and the clamping surface 16A. As a result, the substrate 16 may partially or entirely de-clamp from the substrate pedestal 16. Also, shifting may occur from the center position if undesirable lateral forces overcome the clamping force.

In step 76, the V/I meter 22 continually monitors or samples the phase angle and/or total impedance magnitude of the RF power delivered to the system in the processing chamber 12.

In decision 78, the controller 24 determines if a comfort threshold, indicative of a de-clamping and or shifting issue, has been exceeded or not. As noted above, the comfort threshold may be either static or dynamic. If static, the samples are compared to a static threshold or set of static thresholds. If dynamic thresholds are used, then the samples generated during processing are compared to upper and lower threshold boundaries that typically vary over time. Regardless if the static or dynamic approach is used, if a comfort threshold is not exceeded, then the processing of the substrate in step 74 continues until completion.

In step 80, on the other hand, the substrate is flagged if a comfort threshold (either dynamic or static) is exceeded.

In optional step 82, the substrate processing tool 10, under the controller 24, may implement one or more recovery process options. Such recovery options may include, but are not limited to, increasing the clamping force generated by the clamping surface 16A, pausing the processing of the substrate 18 and/or adjust processing parameters of a process used when processing the substrate 18. It should be noted that this step is optional and can be skipped. For example, if the issue with the substrate is catastrophic, then taking recovery steps may be pointless.

Finally, in step 84, the substrate is removed from the processing chamber 12 so that a next substrate 18 can be processed in its place.

Dynamic Confidence Threshold Examples

Figure 8:
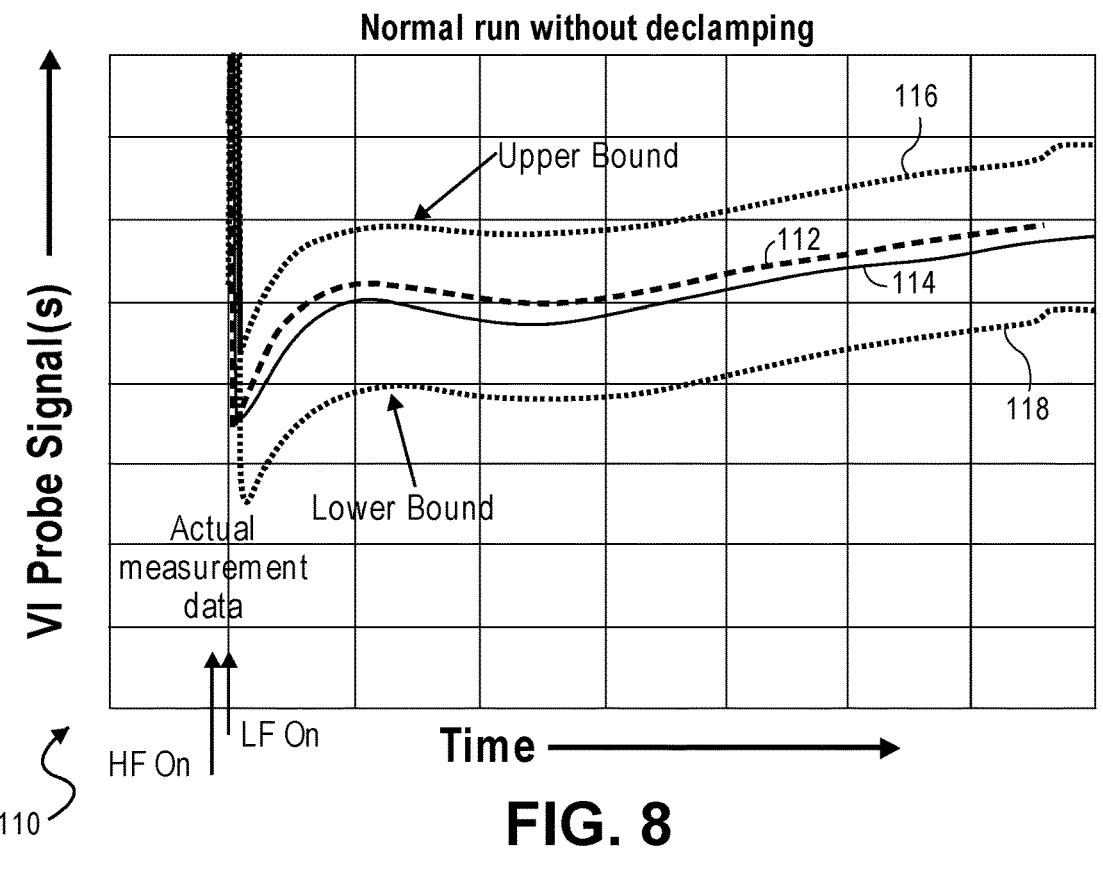
FIG. 8 is an exemplary plot illustrating samples of phase angle and/or impedance magnitude measurements collected during a substrate processing run substantially without gapping, bowing and/or declamping issues.

Referring to FIG. 8, a plot 110 showing dynamic confidence thresholds that change over time during a normal substrate process run is illustrated. Along the vertical axis, the plot 110 includes actual measured values 112 of phase angle and/or impedance magnitude samples plotted over time along the horizontal axis. In this case, since the substrate experiences little to no gapping, bowing and/or shifting, the measured values 112 more or less track a golden curve 114, which was generated from empirical data and which defines upper and lower boundaries 116, 118. Since the measured values 112 remain within the upper and lower boundaries 116, 118 as they vary over time, the substrate run is not flagged as having any issues.

Figure 9:
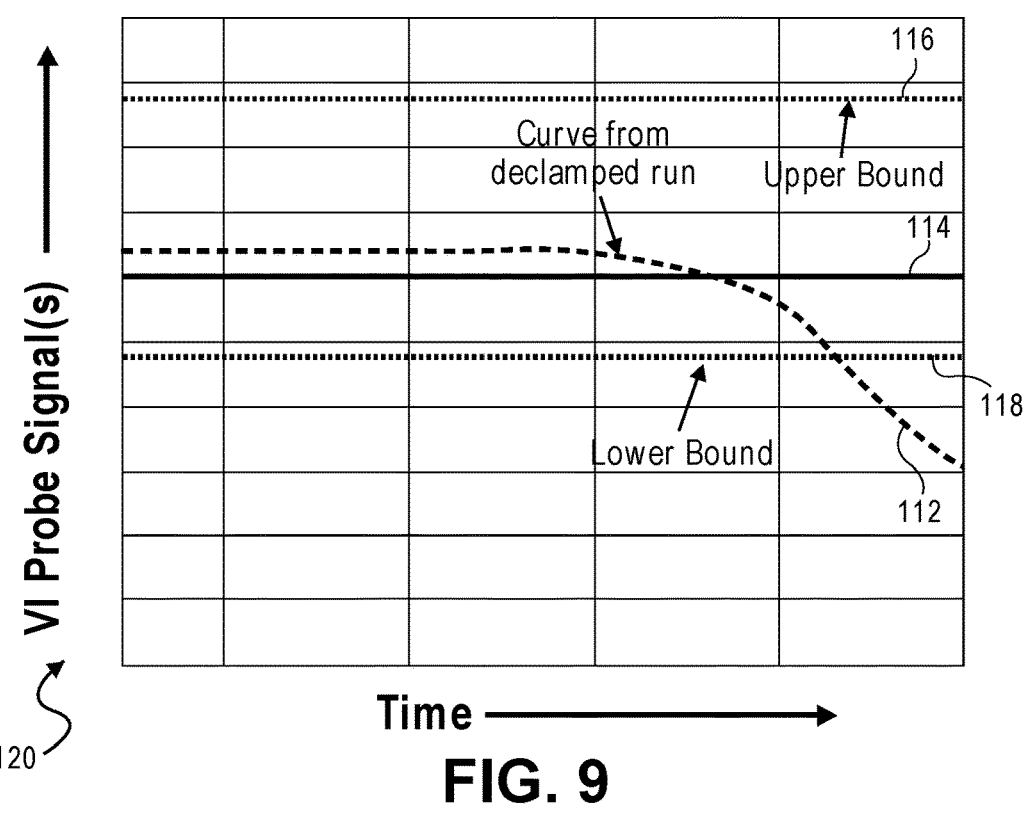
FIG. 9 is an exemplary plot illustrating samples of phase angle and/or impedance magnitude measurements of collected during a substrate processing run when a gap, bowing and/or declamping issue is detected.
Figure 10:
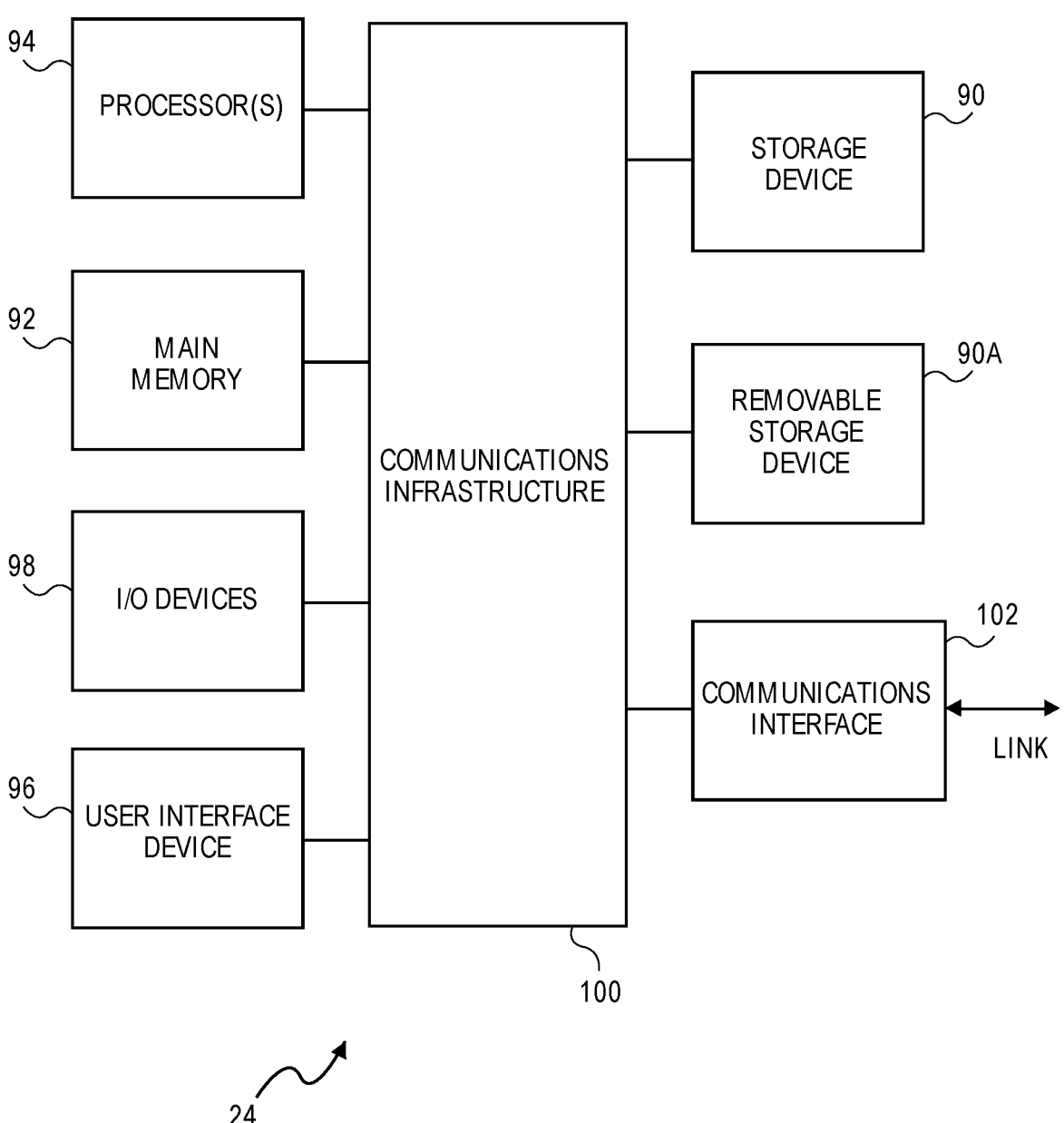
FIG. 10 is a block diagram of a controller used to control the plasma processing tool in accordance with a non-exclusive embodiment of the invention.

Referring to FIG. 9, a plot 120 showing the measured values 112 of another substrate run that exceed one of the dynamic confidence threshold boundary is shown. In this case, the plotted values 112 taper off and fall below the lower boundary 118, signifying that the substrate is experiencing a gapping, bowing and/or shifting issue. As noted above, when such an issue is detected, processing can be either halted or corrective measures taken.

The Controller

The controller 24 typically includes one or more non-transient computer readable medium storage devices 90 and/or main memory 92 for storing system control software or computer code. The term "non-transient computer readable 15 medium" is used generally to refer to any physical media such as main memory, secondary memory, removable storage, and storage devices, such as hard disks, flash memory, disk drive memory, CD-ROM, a removable storage device 90A and other forms of persistent memory and shall not be construed to cover transitory subject matter, such as carrier waves or signals.

The controller 24 may also include one or more processors 94, such as a CPU or computer, multiple CPUs or computers, analog and/or digital input/output connections, motor controller boards, etc. In certain embodiments, the controller 24, running or executing the system software or code, controls all or at some of the activities of the substrate processing tool 10, including such activities as controlling the timing of the processing operations, frequency and power of operations of the RF generator 20, pressure within the processing chamber 12, gas flow rates, concentrations and temperatures of gas(es) into the process chamber 12 and their relative mixing, temperature of a substrate 18 supported by the substrate holder 16, etc.

The controller 24 may also include a user interface 96. The user interface 98 may include one or more Input/Output (I/O) devices 96 such as graphical displays of indicative of operating parameters and/or process conditions of the tool 10, and user input devices such as pointing devices, keyboards, touch screens, microphones, etc., that allow a human operator to interface with the tool 10.

A communications infrastructure 100, such as a computer bus, is provided to enable the various components 90-98 of the controller 24 to communicate with one another. A communications link 102 is provided to enable the controller 24 to communicate with other communication and/or computing systems. The communication, both internal to processor 24 as well as external, may be in the form of signals such as electronic, electromagnetic, optical, or other signals capable of being transmitted and/or received via any communication link that carries signals and may be implemented using wire or cable, fiber optics, a phone line, a cellular phone link, a radio frequency link, and/or other communication channels.

Advantages

The approach described herein for monitoring and detecting the state of a substrate 18 in the processing chamber 12 offers a number of benefits and advantages. First, as deposits accumulate on the walls and other surfaces of the chamber 12, the capacitance in the chamber 12 to the substrate 18 changes. The approach as described herein, however, remains repeatable from substrate to substrate. Second, the ability to detect issues in substrates during processing means either corrective action may be taken, or in severe situations, defective substrates 18 can be identified and scrapped before subsequent process steps occur.

Alternative Embodiments

For the sake of simplicity, the substrate processing tool 10 as illustrated includes only a single substrate processing station. It should be noted that the subject matter as described herein may be used with substrate tools 10 having multiple substrate processing stations.

It should also be noted that although the substrate processing tool 10 as described herein is a film deposition tool, this by no means be construed as limiting. On the contrary, the subject matter described herein may be used with any substrate processing tool using an RF induced plasma to process substrates, such as but not limited to plasma etching tools, or any other type of tool using RF to create a plasma to process a substrate.

In various embodiments, the substrate 18 processed by the substrate processing tool may include semiconductor wafers, flat panel displays or any other work piece. In general, the present application is intended to cover any substrate processing tool using RF induced plasma to process substrates.

It should be understood that the embodiments provided herein are merely exemplary and should not be construed as limiting in any regard. Although only a few embodiments have been described in detail, it should be appreciated that the present application may be implemented in many other forms without departing from the spirit or scope of the disclosure provided herein. Therefore, the present embodiments should be considered illustrative and not restrictive and is not to be limited to the details given herein, but may be modified within the scope and equivalents of the appended claims.

What is claimed is:

1. A substrate processing tool, comprising
a processing chamber;
a substrate pedestal having a surface for supporting a substrate within the processing chamber;
a Radio Frequency (RF) electrode configured to deliver RF power within the processing chamber, the RF power inducing a plasma in the processing chamber when the substrate is being processed; and
a substrate state detection system including a probe capable of measuring RF characteristics that indicate a state of the substrate during processing by measuring a delivered RF power within the processing chamber, the state comprising any of bowing of the substrate, gaps between the substrate and the surface or shifting of the substrate relative to the surface, and the substrate state detection system further including a controller configured to receive one or more data samples derived from the delivered RF power measured by the probe, set a data flag indicting that the substrate as having a gapping, bowing and/or shifting issue if the one or more data samples derived from the measured delivered RF power exceed an upper dynamic comfort threshold or a lower dynamic comfort threshold, and in response to the data flag being set, perform a recovery process operation for the substrate, wherein the upper dynamic comfort threshold and the lower dynamic comfort threshold both shift over time to follow an RF power curve during at least a portion of a processing run in which the substrate is being processed in the processing chamber, and wherein the RF power curve, the upper dynamic comfort threshold, and the lower dynamic comfort threshold are derived from empirical data samples of measured delivered RF power collected during processing runs of substrates that do not have gapping, bowing, or shifting issues.

2. The substrate processing tool of claim 1, wherein:
the RF electrode is arranged to provide constant RF power to the processing chamber; and
the substrate state detection system is further arranged to:
measure real RF power and reactive RF power in the processing chamber; and
ascertain the state of the substrate based on changes in the reactive RF power within the processing chamber.

3. The substrate processing tool of claim 2, wherein the substrate state detection system is further configured to compare a voltage-current phase angle difference of the RF power.

4. The substrate processing tool of claim 3, wherein the voltage-current phase angle increases or decreases as a degree of any bowing, gaping or shifting of the substrate increases or decreases respectively.

5. The substrate processing tool of claim 2, wherein the substrate state detection system is further configured to compare a change in an impedance magnitude of the reactive RF power.

6. The substrate processing tool of claim 5, wherein the change in the impedance magnitude becomes larger or smaller as the degree of the gapping, bowing or shifting become larger or smaller respectively.

7. The substrate processing tool of claim 1, wherein the controller is configured to:
generate the RF power curve from the empirical data samples of measured delivered RF power collected during the processing runs of substrates that do not have gapping, bowing, or shifting issues; and derive the upper dynamic comfort threshold and the lower dynamic comfort threshold from the generated RF power curve.

8. The substrate processing tool of claim 1, wherein the probe includes a voltage/current meter capable of measuring:
   (a) voltage;
   (b) current; and
   (c) a phase angle between the voltage and the current.

9. The substrate processing tool of claim 8, wherein the voltage/current meter is electrically coupled in series between an RF source and the RF electrode.

10. The substrate processing tool of claim 2, wherein the changes in the measured reactive RF power are indicative of changes in capacitance between the substrate and the surface of the substrate pedestal, wherein the capacitance:
   decreases as the magnitude of the gap increases; and
   increases as the magnitude of the gap decreases.

11. The substrate processing tool of claim 2, wherein the changes in the measured reactive RF power are indicative of changes in capacitance between the substrate and the surface of the substrate pedestal, wherein the capacitance:
   decreases as the degree of the shifting of the substrate increases; and
   increases as the degree of the shifting of the substrate decreases.

12. The substrate processing tool of claim 1, wherein the RF electrode is positioned on or within the substrate pedestal.

13. The substrate processing tool of claim 1, wherein the surface of the substrate pedestal for supporting the substrate is further configured to clamp the substrate to the surface.

14. The substrate processing tool of claim 1, wherein the recovery process operation includes at least one of:
   (a) increasing a clamping force for clamping the substrate to the surface of the substrate pedestal;
   (b) pausing the processing of the substrate; or
   (c) adjusting one or more processing parameters of a process used when processing the substrate.

15. The substrate processing tool of claim 1, wherein the substrate processing tool is one of the following Plasma Enhanced Chemical Vapor Deposition (PECVD) tool, a Low Pressure (LPCVD), Ultra High Vacuum (UHVCVD), Atomic Layer Deposition (ALD), Plasma-Enhanced Atomic Layer Deposition (PEALD) or a plasma etching tool.

16. A substrate processing tool including a probe capable of measuring RF characteristics indicating observed behavior of RF power delivered to a processing chamber of the substrate processing tool, and a controller configured to receive one or more data samples derived from the RF characteristics measured by the probe, detect a gap and/or shifting of a substrate positioned on a support surface in the processing chamber based on the observed behavior of the RF power delivered to the processing chamber as indicated by the one or more data samples derived from the RF characteristics measured by the probe exceeding an upper dynamic comfort threshold or a lower dynamic comfort threshold, and in response to detecting the gap and/or shifting of the substrate, perform a recovery process operation for the substrate, wherein the upper dynamic comfort threshold and the lower dynamic comfort threshold both shift over time to follow an RF power curve during at least a portion of a processing run in which the substrate is being processed in the processing chamber, and wherein the RF power curve, the upper dynamic comfort threshold, and the lower dynamic comfort threshold are derived from empirical data samples of measured delivered RF power collected during processing runs of substrates that do not have gapping, bowing, or shifting issues.

17. The substrate processing tool of claim 16, wherein the behavior of the delivered RF power is observed from changes in a magnitude of a reactive component with respect to a magnitude of a real component of the delivered RF power.

18. The substrate processing tool of claim 16, wherein the behavior of the RF power is observed by comparing a voltage-current phase angle difference between a real RF power component and a reactive RF power component of the RF power delivered to the processing chamber.

19. The substrate processing tool of claim 18, where a degree of the voltage-current phase angle difference is proportional to a size of the gap and/or a degree of the shifting.

20. The substrate processing tool of claim 16, wherein presence of the gap and/or the shifting of the substrate is determined by ascertaining an impedance magnitude change of a real RF power component and/or a reactive RF power component of the RF power delivered to the processing chamber.

21. The substrate processing tool of claim 20, wherein the impedance magnitude is proportional to the size of the gap and/or the degree of the shifting.

22. The substrate processing tool of claim 16, wherein the controller is configured to set a data flag in response to detecting the gap and/or the shifting of the substrate, and wherein the controller is configured to perform the recovery process operation for the substrate in response to the data flag being set.

23. The substrate processing tool of claim 16, wherein the probe includes a Voltage/Current ("V/I") meter, the V/I meter arranged to measure:
   (a) voltage;
   (b) current; and
   (c) a phase angle between the voltage and the current.

24. The substrate processing tool of claim 23, wherein the V/I meter is coupled in series between a RF source and a RF electrode, wherein the V/I meter is embedded in a substrate pedestal defining the support surface, and wherein the RF source is used for delivering the RF power to the processing chamber.

25. A substrate processing tool including a controller, operating in cooperation with a Voltage or Current ("V/I") meter capable of measuring RF characteristics indicating observed behavior of RF power delivered to a processing chamber of the substrate processing tool, the controller being configured to receive one or more data samples derived from the RF characteristics measured by the V/I meter, and set a data flag indicating that a substrate undergoing processing in the processing chamber as having a gap and/or having shifted, relative to a surface of a substrate pedestal supporting the substrate in the processing chamber based on the one or more data samples derived from the observed behavior of the RF power delivered to the processing chamber as measured by the V/I meter exceeding an upper dynamic comfort threshold or a lower dynamic comfort threshold, wherein the upper dynamic comfort threshold and the lower dynamic comfort threshold both shift over time to follow an RF power curve during at least a portion of a processing run in which the substrate is being processed in the processing chamber, and wherein the RF power curve, the upper dynamic comfort threshold, and the lower dynamic comfort threshold are derived from empirical data samples of measured delivered RF power collected during processing runs of substrates that do not have gapping, bowing, or shifting issues.

26. The substrate processing tool of claim 25, wherein the behavior of the RF power is observed by comparing a voltage-current phase angle difference between a real RF power component and a reactive RF power component of the RF power delivered to the processing chamber.

27. The substrate processing tool of claim 25, wherein behavior of the RF power is observed by comparing a change in impedance magnitude between a real RF power component and a reactive RF power component of the RF power delivered to the processing chamber.

28. The substrate processing tool of claim 25, wherein the V/I meter is arranged to measure one or more parameters of a real RF component and a reactive RF component of the RF power supplied to the processing chamber, the one or more parameters including:

(a) voltage;

(b) current; and (c) phase angle.

29. The substrate processing tool of claim 16, wherein the controller is configured to:

generate the RF power curve from the empirical data samples of the measured delivered RF power collected from the processing runs of the substrates that do not have gapping, bowing, or shifting issues; and derive the upper dynamic comfort threshold and the lower dynamic comfort threshold from the generated RF power curve.

30. The substrate processing tool of claim 25, wherein the controller is configured to:

generate the RF power curve from the empirical data samples of the measured delivered RF power collected from the processing runs of the substrates that do not have gapping, bowing, or shifting issues; and derive the upper dynamic comfort threshold and the lower dynamic comfort threshold from the generated RF power curve.

* * * * *